(12) United States Patent
Sato et al.

(10) Patent No.: US 8,541,962 B2
(45) Date of Patent: Sep. 24, 2013

(54) MOTOR DRIVING APPARATUS

(75) Inventors: Kazuo Sato, Kitakyushu (JP); Mitsujiro Sawamura, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 65 days.

(21) Appl. No.: 13/297,273

(22) Filed: Nov. 16, 2011

(65) Prior Publication Data

US 2012/0217922 A1    Aug. 30, 2012

(30) Foreign Application Priority Data

Feb. 24, 2011    (JP) ................................ 2011-039055

(51) Int. Cl.
*H02P 5/00*      (2006.01)
*H02P 27/04*    (2006.01)

(52) U.S. Cl.
USPC ........................................... 318/49; 318/802

(58) Field of Classification Search
USPC ................... 318/49, 802; 361/30; 363/56.03
See application file for complete search history.

(56) References Cited

U.S. PATENT DOCUMENTS

| | | | |
|---|---|---|---|
| 8,022,658 B2 * | 9/2011 | Ide ................................ | 318/802 |
| 2006/0158197 A1 | 7/2006 | Horikoshi et al. | |
| 2008/0094022 A1 * | 4/2008 | Horikoshi et al. ............ | 318/802 |
| 2009/0195205 A1 | 8/2009 | Ide | |

FOREIGN PATENT DOCUMENTS

| | | | |
|---|---|---|---|
| JP | 62-062267 | | 4/1987 |
| JP | 11215690 | * | 8/1999 |
| JP | 2006-226993 | | 8/2006 |
| JP | 2009-204600 | | 9/2009 |

OTHER PUBLICATIONS

Japanese Office Action for corresponding JP Application No. 2011-039055, Dec. 20, 2011.

* cited by examiner

*Primary Examiner* — Eduardo Colon Santana
*Assistant Examiner* — Devon Joseph
(74) *Attorney, Agent, or Firm* — Ditthavong Mori & Steiner, P.C.

(57) ABSTRACT

A motor driving apparatus includes a motor driving unit, a low-voltage source, a current detecting element, and an insulation resistance degradation determinator. The motor driving unit includes an inverter coupled between a positive DC bus line and a negative DC bus line of a DC power source. The inverter converts DC power into AC power to drive an AC motor. The low-voltage source is coupled between a ground and at least one of the positive DC bus line and the negative DC bus line. The current detecting element detects a closed circuit current flowing through a closed circuit of the low-voltage source, the AC motor, and a part of the inverter. The insulation resistance degradation determinator makes a comparison between the closed circuit current and a predetermined threshold, and configured to determine, based on the comparison, whether an insulation resistance of the AC motor is degraded.

20 Claims, 3 Drawing Sheets

MOTOR DRIVING APPARATUS

CROSS-REFERENCE TO RELATED APPLICATIONS

The present application claims priority under 35 U.S.C. §119 to Japanese Patent Application No. 2011-039055, filed Feb. 24, 2011. The contents of this application are incorporated herein by reference in their entirety.

BACKGROUND OF THE INVENTION FIELD OF THE INVENTION

1. Field of the Invention

The present invention relates to a motor driving apparatus.

2. Discussion of the Background

Japanese Unexamined Patent Application Publication No. 2006-226993 discloses a motor driving apparatus to detect degradation of an insulation resistance of a motor. In the motor driving apparatus, a first point of contact is disposed between a negative line of a DC link and the ground. A second point of contact and an electric current detector are coupled to one another in series between a positive line of the DC link and one phase wire of coil coupling wires of the motor. In order to detect degradation of the insulation resistance, the first point of contact and the second point of contact are closed to form a closed circuit of a smoothing capacitor, the second point of contact, the electric current detector, the coil of the motor, the ground, the first point of contact, and the smoothing capacitor. The charging voltage of the smoothing capacitor is applied to the closed circuit. Thus, detecting the current through the closed circuit leads to detection of degradation of the insulation resistance of the motor.

SUMMARY OF THE INVENTION

According to one aspect of the present invention, a motor driving apparatus includes at least one motor driving unit, a low-voltage source, a current detecting element, and an insulation resistance degradation determinator. The at least one motor driving unit includes an inverter coupled between a positive direct current bus line and a negative direct current bus line of a direct current power source. The inverter is configured to convert direct current power into alternating current power to drive an alternating current motor. The low-voltage source is coupled between a ground and at least one of the positive direct current bus line and the negative direct current bus line. The current detecting element is configured to detect a closed circuit current flowing through a closed circuit of the low-voltage source, the alternating current motor, and a part of the inverter. The insulation resistance degradation determinator is configured to make a comparison between the closed circuit current detected by the current detecting element and a predetermined threshold, and configured to determine, based on the comparison, whether an insulation resistance of the alternating current motor is degraded.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Figure 1:
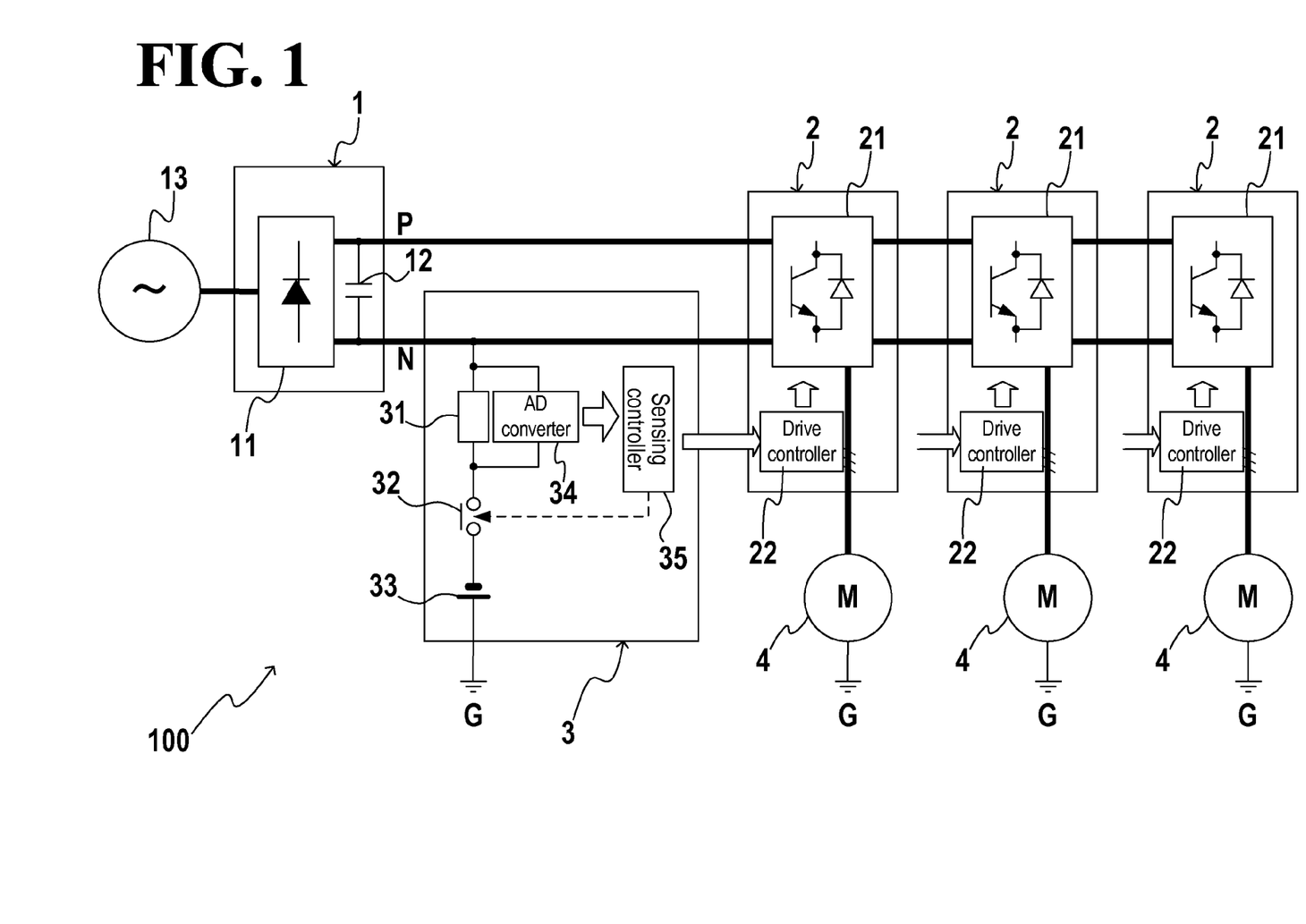
FIG. 1 is a block diagram schematically illustrating a configuration of a motor driving apparatus according to an embodiment of the present invention.

FIG. 1 is a block diagram schematically illustrating a configuration of a motor driving apparatus according to an embodiment of the present invention.

As shown in FIG. 1, a motor driving apparatus 100 drives a three-phase alternating current motor 4 and includes a converter 1, a motor driving unit 2, and an insulation degradation detecting unit 3.

The converter 1 includes, for example, a rectifier 11 and a smoothing capacitor 12. In the converter 1, the rectifier 11 rectifies alternating current power, which is supplied from an alternating current source 13, and the smoothing capacitor 12 smoothes the output power of the rectifier 11. The converter 1 supplies the resulting direct current power to direct current bus lines P and N. The upper direct current bus line P among the two direct current bus lines P and N is a positive direct current bus line, while the lower direct current bus line N is a negative direct current bus line. The smoothing capacitor 12 is coupled across the two direct current bus lines P and N.

The motor driving unit 2 in this example includes inverters 21 and drive controllers 22. The inverters 21 each include bridge-coupled six switching elements of semiconductors (only one is shown in FIG. 1 for simplicity). Each of the drive controllers 22 executes switching control of the individual switching elements of the corresponding inverter 21. The inverters 21 are coupled to the two direct current bus lines P and N to be supplied with direct current power. Each drive controller 22 repeatedly opens and closes the six switching elements of the corresponding inverter 21 in an appropriate order, thereby generating three-phase alternating power of a predetermined frequency. In this embodiment, three motor driving units 2 are coupled in parallel with each other on the two direct current bus lines P and N so as to form a three-axis drive configuration, where each inverter 21 supplies three-phase alternating power to the corresponding three-phase alternating current motor 4. The drive control executed by the drive controllers 22 with respect to the inverters 21 is based on commands from an upper controller, not shown. The drive controller 22 also executes open/close switching control of a predetermined switching element based on a command from a detection control element, described later, at the time of the degradation detecting of the insulation resistance of the three-phase alternating current motor 4. The circuit configuration of the inverter 21 and the three-phase alternating current motor 4 will be described in detail later by referring to FIG. 2.

The insulation degradation detecting unit 3 includes a detecting resistor 31, a detecting switch 32, a low-voltage source 33, an AD converter 34, and a detection control element 35. The detecting resistor 31 is a resistor having a known resistance value. The detecting switch 32 is open/close switchable between two terminals based on a control signal from the detection control element 35. The low-voltage source 33 is a direct current power source that outputs a sufficiently low voltage as compared with the alternating current source 13, examples including a low voltage battery. It is also possible to use a step-down direct current voltage supplied from a driving power source, not shown, of the insulation degradation detecting unit 3 itself. In this example, the detecting resistor 31, the detecting switch 32, and the low-voltage source 33 are coupled to each other in series in this order, with the result that this entire series circuit is coupled across the negative direct current bus line N and the ground G. The low-voltage source 33 is arranged with its positive polarity coupled to the ground G. In the example shown, the order of series coupling starting negative direct current bus line N is the detecting resistor 31, the detecting switch 32, and the low-voltage source 33. Any other order is possible insofar as series coupling is ensured.

The AD converter 34 is coupled in parallel to the detecting resistor 31 to detect a voltage between the terminals of the detecting resistor 31 in analog values and convert the voltage into digital signals. The AD converter 34 outputs the digital signals to the detection control element 35. As described above, since the resistance value of the detecting resistor 31 is known, detecting the voltage between the terminals of the detecting resistor 31 is equivalent to the detecting of the current through the detecting resistor 31.

The detection control element 35 includes CPU, RAM, ROM, and the like, which are not shown. In response to a command from the upper controller, not shown, the detection control element 35 commands a drive controller 22 of a predetermined motor driving unit 2 to switch to open or close a predetermined switching element of the corresponding inverter 21. The detection control element 35, at the same time, controls the open/close switching of the detecting switch 32, and determines whether the insulation resistance of the three-phase alternating current motor 4 corresponding to the predetermined motor driving unit 2 is degraded based on information input from the AD converter 34 indicating the voltage between the terminals of the detecting switch 32.

The ground G corresponds to the ground recited in the accompanying claims, while the detecting resistor 31 and the AD converter 34 correspond to the current detecting element recited in the accompanying claims.

Figure 2:
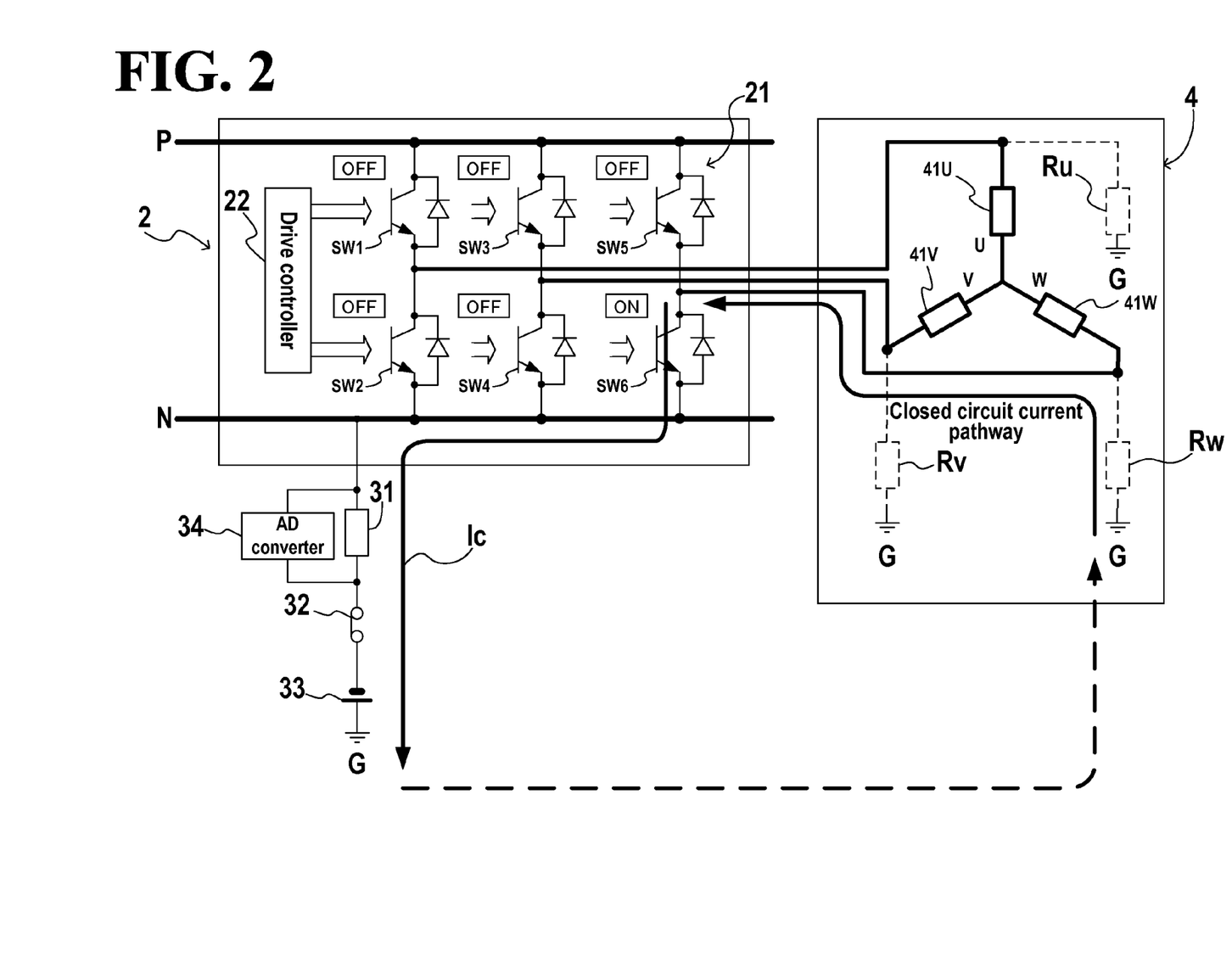
FIG. 2 is a diagram illustrating a circuit configuration of a part of an insulation degradation detecting unit, a motor driving unit, and a three-phase alternating current motor.

FIG. 2 is a block diagram illustrating a circuit configuration of a part of the insulation degradation detecting unit 3, the motor driving unit 2, and the three-phase alternating current motor 4.

As shown in FIG. 2, the inverter 21 of the motor driving unit 2 includes, as described above, six switching elements SW1 to SW6 of semiconductors (IGBTs in the example shown). The six switching elements SW1 to SW6 are in the form of three pairs of series-coupled switching elements. The three pairs are bridge-coupled in parallel to each other across the direct current bus lines P and N. With direct current power supplied to the two direct current bus lines P and N, the drive controller 22 repeatedly opens and closes the six switching elements SW1 to SW6 in an appropriate order. This results in inverter outputs of U, V, and W, which are three phases of alternating power output from between the respective two series-coupled switching elements of the three pairs. In the example shown, the three switching elements SW1, SW3, and SW5, which are coupled to the positive direct current bus line P, are referred to as upper arm switching elements, while the three switching elements SW2, SW4, and SW6, which are coupled to the negative direct current bus line N, are referred to as lower arm switching elements. The three lower arm switching elements SW2, SW4, and SW6 in this example correspond to the phase switching elements and the axis switching elements recited in the accompanying claims.

In normal drive control, under which the inverter 21 is made to output the three phases U, V, and W of alternating power, the drive controller 22 executes switching control of the switching elements SW1 to SW6 in accordance with a command from the upper controller, not shown, as described above. At the time of the degradation detecting of the insulation resistance of the three-phase alternating current motor 4, the drive controller 22 executes switching control of the switching elements SW1 to SW6 in accordance with a command from the detection control element 35 of the insulation degradation detecting unit 3.

The three-phase alternating current motor 4 is a motor driven by the three-phase alternating power output from the inverter 21. In the drawings, the three-phase alternating current motor 4 is shown only with its winding coils 41U, 41V, and 41W, which are armatures to execute field control. In the three-phase alternating current motor 4 used in this embodiment, the three armature winding coils 41U, 41V, and 41W have the same coil turns and are coupled to each other in Y-connection while respectively corresponding to the phases U, V, and W of the three-phase alternating current. The three armature winding coils 41U, 41V, and 41W have their radially outer terminals respectively coupled to the output terminals of the three phases U, V, and W of the inverter 21. In addition to a stator formed by the three armature winding coils 41U, 41V, and 41W, the three-phase alternating current motor 4 includes a rotor having permanent magnets, and a casing to accommodate the stator and the rotor (stator and casing are not shown). The casing is grounded to the ground G, which is common with the insulation degradation detecting unit 3. The three-phase alternating current motor 4 corresponds to the polyphase alternating current motor recited in the accompanying claims.

In this respect, the three armature winding coils 41U, 41V, and 41W are individually molded to structurally ensure electrical insulating properties with respect to the casing. However, the insulation resistance can degrade through long-term use, through elapse of time, or depending on the application environment. When the insulation resistance of the three-phase alternating current motor 4 degrades, the current through the armature winding coils 41U, 41V, and 41W can leak to the ground G via the casing. This, as a result, not only undermines the rated performance but also causes damage to the three-phase alternating current motor 4.

In view of this, in this embodiment, the insulation degradation detecting unit 3 detects the insulation resistance of the three-phase alternating current motor 4 and determines whether the insulation resistance is degraded, before or during the normal drive control, under which the inverter 21 is made to output the three phases U, V, and W of alternating power. Specifically, without feeding of power from the converter 1, the detection control element 35 commands the drive controller 22 of any motor driving unit 2 to close any one of the lower arm switching elements SW2, SW4, and SW6 of the corresponding inverter 21 (SW6 is indicated ON in FIG. 2), and subsequently closes the detecting switch 32 of the insulation degradation detecting unit 3. This results in a closed circuit as a pathway for the current to flow through with the low-voltage source 33 of the insulation degradation detecting unit 3 serving as an electromotive force unit. The pathway is formed by, in the order shown in FIG. 2, the ground G, the three-phase alternating current motor 4, the closed lower arm switching element SW6 of the inverter 21, the negative direct current bus line N, the detecting resistor 31, and the detecting switch 32. The current flowing through the closed circuit is referred to as a closed circuit current Ic.

Then, the AD converter 34 detects the voltage between the terminals of the detecting resistor 31, through which the closed circuit current Ic flows. The detection control element 35 uses the information on the voltage between the terminals of the detecting resistor 31 as a basis to detect the insulation resistance of the three-phase alternating current motor 4, which is coupled to the inverter 21. When the insulation resistance of the three-phase alternating current motor 4 is large, the closed circuit current Ic is small, whereas as the degradation of the insulation resistance progresses, the closed circuit current Ic increases. When the voltage between the terminals of the detecting resistor 31, which is proportionate to the closed circuit current Ic, exceeds a predetermined threshold, the detection control element 35 determines that the insulation resistance is degraded, and makes a notification in that regard. The predetermined threshold is determined in advance based on an insulation resistance value that is known at the time of design of the three-phase alternating current motor 4 or at the time of a test of the three-phase alternating current motor 4 as a single entity. That is, the predetermined threshold is set at a possible value of voltage that can be observed between the terminals of the detecting resistor 31 when the closed circuit current Ic flows therethrough in the case where the degradation of the insulation resistance progresses to a substantial degree.

With the example in FIG. 2, only the lower arm switching element SW6, which corresponds to the W phase of the inverter 21, is closed. This makes the closed circuit current Ic flow in the three-phase alternating current motor 4 mainly through an imaginary insulation resistance Rw, which is located between the armature winding wire 41W of the W phase and the casing. Fundamentally, the insulation resistance in the three-phase alternating current motor 4 is intended as a structural resistance with respect to the entire casing. However, a tendency appears toward occurrence of individual imaginary insulation resistances Ru, Rv, and Rw respectively associated with the phases U, V, and W, and the imaginary insulation resistances Ru, Rv, and Rw likely show mutually different manners of degradation progress. The difference in degradation among the phases especially increases immediately before a leak. This is addressed by the detection control element 35, which selectively closes any one of the three lower arm switching elements SW2, SW4, and SW6 of one inverter 21. This ensures, in one three-phase alternating current motor 4, selective detecting of one of the insulation resistance Ru, Rv, and Rw corresponding to the phase associated with the closed lower arm switching element. The closed circuit current Ic can be detected not only in the case of closing only one of the three lower arm switching elements SW2, SW4, and SW6 of one inverter 21. Other possible examples include the case of closing all of the three lower arm switching elements and the case of closing any two of the three lower arm switching elements. The availability of various manners of selection of the lower arm switching elements SW2, SW4, and SW6 ensures diverse and detailed degradation detecting of the insulation resistance of one three-phase alternating current motor 4. Still, to even consider identifying the phase of degraded insulation in the three-phase alternating current motor 4, it is preferred to selectively close the three lower arm switching elements SW2, SW4, and SW6 phase by phase in order.

When the employed circuit configuration of the closed circuit at least includes, for example, switching elements of the inverter 21 along the pathway, a weak current flows through the closed circuit. That is, even if the lower arm switching elements SW2, SW4, and SW6 of the inverter 21 are open, when the detecting switch 32 of the insulation degradation detecting unit 3 is closed, application of a certain voltage can cause a weak current equivalent to, for example, leakage current to flow through the pathway of the closed circuit in spite of the insulation. The weak current corresponds to the offset current in the closed circuit and constitutes a current detecting error at the time of detecting of the insulation resistance. Hence, the influence of the weak current is not negligible. Even though this current is weak in only one set configuration of the motor driving unit 2 and the three-phase alternating current motor 4, the current accumulates in multi-axis drive configurations, where the motor driving unit 2 and the three-phase alternating current motor 4 are provided in multiple sets. This further creates non-negligible influence on detecting of the insulation resistance. This embodiment establishes a mode to detect only the weak current (hereinafter referred to as the offset current) in response to a command from the upper controller, not shown, thus ensuring detecting of the offset current in the entire circuit of the multi-axis driving configuration. The influence of the offset current is eliminated at the time of detecting of the individual insulation resistance of each three-phase alternating current motor 4.

A prerequisite for the detecting of the insulation resistance of the three-phase alternating current motor 4 and the offset current is that the feeding of power from the converter 1 be stopped. Even if the smoothing capacitor 12 of the converter 1 is charged, this will not have any direct influence on the detecting of the insulation resistance and the offset current, insofar as all of the upper arm switching elements SW1, SW3, and SW5 of the inverter 21 are open. However, in practice, the drive circuit can be influenced via a dynamic brake and other parts, not shown. In view of this, it is necessary that the smoothing capacitor 12 be thoroughly discharged at the time of detecting of the insulation resistance and the offset current.

The above-described functions are implemented by a control process executed at the CPU of the detection control element 35, which will be described below step by step by referring to FIG. 3.

Figure 3:
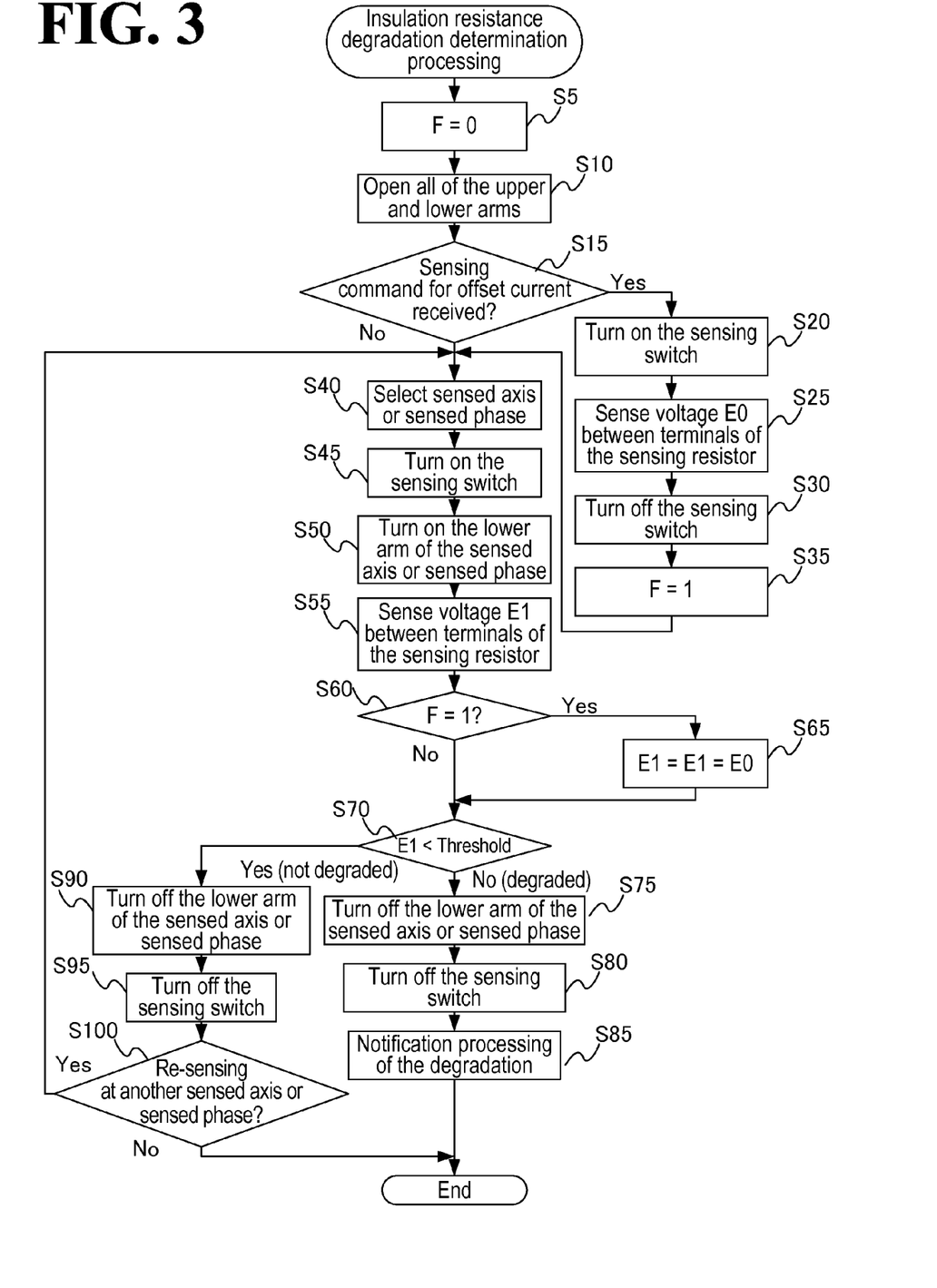
FIG. 3 is a flowchart of control processing executed by a CPU of a detection control element.

As shown in FIG. 3, the process on the flowchart starts, for example, upon reception of a command from the upper controller indicating execution of a detecting process of the insulation degradation. When the process on the flow starts, it is necessary that as described above, the smoothing capacitor 12 be thoroughly discharged by, for example, ensuring a sufficiently long period of time after the previous stopping of the feeding of power from the converter 1.

First, at step S5, the value of F is initialized to 0.

Then, the process proceeds to step S10, where a command is made to the drive controllers 22 of all of the motor driving units 2 to open the switching elements SW1 to SW6 (indicated upper and lower arms in FIG. 3 for simplicity), which are the upper arms and the lower arms altogether of each inverter 21.

Then, the process proceeds to step S15, where a determination is made as to whether a command to detect the offset current is received from the upper controller. When the detecting command is received from the upper controller, the determination is affirmative and the process proceeds to step S20.

At step S20, the detecting switch 32 of the insulation degradation detecting unit 3 is closed to form the closed circuit, thus allowing the offset current to flow through the detecting resistor 31 by way of the closed circuit.

Then, the process proceeds to step S25, where the voltage between the terminals of the detecting resistor 31 is detected at the AD converter 34 while the offset current is flowing through the detecting resistor 31. The detected voltage is stored as E0. As described above, since the resistance of the detecting resistor 31 is known, detecting the voltage E0 between the terminals of the detecting resistor 31 is equivalent to the detecting of the offset current.

Then, the process proceeds to step S30, where the detecting switch 32 of the insulation degradation detecting unit 3 is opened.

Then, the process proceeds to step S35, where the value of flag F is set at 1, and then the process proceeds to step S40.

When in the determination at step S15 the detecting command of the offset current is not received from the upper controller, the determination is negative, and nothing is further executed and the process proceeds step S40.

At step S40, based on the command from the upper controller, the three-phase alternating current motor 4 (indicated detected axis in FIG. 3 for simplicity) from which to detect the insulation resistance is set, and which phase (indicated detected phase in FIG. 3 for simplicity) of the three-phase alternating current motor 4 to detect for the insulation resistance is set. While in this case the detected axis to be set is one, one or a plurality of phases may be detected, as described above.

Then, the process proceeds to step S45, where the detecting switch 32 of the insulation degradation detecting unit 3 is closed.

Then, the process proceeds to step S50, where a command is made to the drive controller 22 of the motor driving unit 2 corresponding to the detected axis set at step S40 to close any of the lower arm switching elements SW2, SW4, and SW6 corresponding to the detected phase set at step S40. This results in a closed circuit corresponding to the detected phase of the detected axis set at step S40, thus allowing the closed circuit current Ic to flow through the detecting resistor 31 by way of the closed circuit.

Then, the process proceeds to step S55, where a voltage E1 between the terminals of the detecting resistor 31 is detected at the AD converter 34 while the closed circuit current Ic is flowing through the detecting resistor 31. Also in this case, detecting the voltage E1 between the terminals of the detecting resistor 31 is equivalent to the detecting of the closed circuit current Ic.

Then, the process proceeds to step S60, where a determination is made as to whether the value of flag F is 1. In other words, in response to the command from the upper controller, a determination is made as to whether the offset current and the voltage E0 between the terminals of the detecting resistor 31 associated with the offset current have been detected. When the value of flag F is 1, the determination is affirmative and the process proceeds to step S65.

At step S65, the voltage E0 between the terminals of the detecting resistor 31, which is detected at step S25, is subtracted from the voltage E1 between the terminals of the detecting resistor 31, which is detected at step S55. That is, this processing is an offset subtraction to eliminate the underlying offset current in the closed circuit current Ic. This ensures detecting of only the closed circuit current Ic flowing through the detected axis and the detected phase currently constituting the closed circuit, and eliminates the influence of the offset current in the closed circuit. Then, the process proceeds to step S70. The new voltage E1 between the terminals of the detecting resistor 31 calculated at step S65 corresponds to the difference recited in the accompanying claims.

When in the determination at step S60 the value of flag F is not 1, the determination is negative, and nothing is further executed and the process proceeds to step S70.

At step S70, a determination is made as to whether the voltage E1 between the terminals of the detecting resistor 31 is smaller than a predetermined threshold. This threshold is set at a possible value of voltage that can be observed between the terminals of the detecting resistor 31 when the closed circuit current Ic flows therethrough in the case where the degradation of the insulation resistance progresses to a substantial degree. When the voltage E1 between the terminals of the detecting resistor 31 is equal to or more than the predetermined threshold, the determination is negative, that is, it is assumed that the insulation resistance is sufficiently degraded at the phase in question of the three-phase alternating current motor 4 in question, which are currently constituting the closed circuit. Then, the process proceeds to step S75.

At step S75, a command is made to the drive controller 22 of the motor driving unit 2 corresponding to the detected axis set at step S40 to open one of the lower arm switching elements SW2, SW4, and SW6 corresponding to the detected phase set at step S40.

Then, the process proceeds to step S80, where the detecting switch 32 of the insulation degradation detecting unit 3 is opened.

Then, the process proceeds to step S85, where degradation notifying processing is executed, so as to notify the degradation of the insulation resistance. Specifically, the notification may be by an indication on a separate display or by a sound from a separate sounding unit. It is also possible to transmit information on the degradation to the upper controller. Then, the flow ends.

When in the determination at step S70 the voltage E1 between the terminals of the detecting resistor 31 is smaller than the predetermined threshold, the determination is affirmative, that is, it is assumed that there is still no degradation in the insulation resistance of the phase in question of the three-phase alternating current motor 4 in question, which are currently constituting the closed circuit. Then, the process proceeds to step S90.

At step S90, a command is made to the drive controller 22 of the motor driving unit 2 corresponding to the detected axis set at step S40 to open one of the lower arm switching elements SW2, SW4, and SW6 corresponding to the detected phase set at step S40.

Then, the process proceeds to step S95, where the detecting switch 32 of the insulation degradation detecting unit 3 is opened.

Then, the process proceeds to step S100, where a determination is made as to whether a command to re-detect the insulation resistance in some other detected axis or in some other detected phase is received from the upper controller. When a command for re-detecting is received from the upper controller, the determination is affirmative and the process returns to step S40, where a similar procedure is repeated. When a command for re-detecting is not received from the upper controller, the determination is negative, and the flow ends.

The processing executed at step S40 and the processing executed at step S50 in the flow on FIG. 3 correspond to the phase selector and the axis selector recited in the accompanying claims. The processing executed at step S25 corresponds to the offset current detecting element recited in the accompanying claims. The processing executed at step S65 corresponds to the offset removal element recited in the accompanying claims. The processing executed at step S70 corresponds to the insulation resistance degradation determinator recited in the accompanying claims.

As has been described hereinbefore, in the motor driving apparatus 100 according to this embodiment, the smoothing capacitor 12 is not included in the closed circuit, which is formed when the closed detecting switch 32 is closed. This ensures that the motor driving apparatus 100 detects degradation of the insulation resistance of the three-phase alternating current motor 4 without being influenced by the charged power of the smoothing capacitor 12. This eliminates the need for waiting for the smoothing capacitor 12 to be charged before starting the degradation detecting of the insulation resistance of the three-phase alternating current motor 4, as opposed to the practice of utilizing the charged power of the smoothing capacitor 12 in detecting degradation of the insulation resistance of the three-phase alternating current motor 4. Additionally, since the voltage applied from the low-voltage source 33 to the closed circuit is low, the current does not flow through the closed circuit in large amounts, as opposed to the practice of utilizing the charged power of the smoothing capacitor 12. This minimizes secondary damage, such as breakage, to other parts on the closed circuit. Further, the voltage applied from the low-voltage source 33 to the closed circuit is maintained at a constant level. This minimizes variation in current through the closed circuit, which can otherwise occur in accordance with a reduction in voltage, as opposed to the practice of utilizing the charged power of the smoothing capacitor 12. This, as a result, minimizes degradation of the detecting accuracy of degradation of the insulation resistance of the three-phase alternating current motor 4.

It is particularly noted that in this embodiment, the inverter 21 includes a plurality of lower arm switching elements SW2, SW4, and SW6 corresponding to the respective phases of the three-phase alternating current motor 4. Any of the plurality of lower arm switching elements SW2, SW4, and SW6 is selectively closed by the processing at step S40 and the processing at step S50 in the flow on FIG. 3. This makes the closed circuit run through the particular phase in the three-phase alternating current motor 4. This ensures selective degradation detecting of the insulation resistance of the three-phase alternating current motor 4 in terms of a phase or in terms of a combination of phases. This, as a result, ensures more detailed detecting of the state of insulation resistance of the three-phase alternating current motor 4.

It is particularly noted that in this embodiment, the inverters 21 of the plurality of motor driving units 2 each individually include the plurality of lower arm switching elements SW2, SW4, and SW6. Any of the plurality of lower arm switching elements SW2, SW4, and SW6 is selectively closed by the processing at step S40 and the processing at step S50. This makes the closed circuit run through the three-phase alternating current motor 4. This ensures selective degradation detecting of the insulation resistance of any of the plurality of three-phase alternating current motors 4. Additionally, in applications to multi-axis motor driving apparatuses as in this embodiment, the closed circuit is formed by the existing inverter 21 dedicated to each axis and by the common direct current bus lines, the detecting resistor 31, the AD converter 34, and the low-voltage source 33. This eliminates the need for providing the detecting resistor 31, the AD converter 34, and the low-voltage source 33 in each three-phase alternating current motor 4. This facilitates applications to multi-axis motor driving apparatuses while minimizing the increase in apparatus size, the increase in price, and degradation of reliability that can otherwise be caused by the increase in piece-part count.

In multi-axis motor driving apparatuses, the circuit configuration including the switching elements of the inverters 21 enlarges cumulatively in proportion to the number of axes. This causes a substantial level of offset current even if all of the lower arm switching elements SW2, SW4, and SW6 are open. In view of this, in this embodiment, the offset current is detected by the processing at step S25, and the detected offset current (corresponding to the voltage E0 between the terminals of the detecting resistor 31) is subtracted from the closed circuit current Ic (corresponding to the initial voltage E1 between the terminals of the detecting resistor 31) by the processing at step S65. This ensures highly accurate detecting of only the closed circuit current Ic (corresponding to the resulting voltage E1 after subtraction) flowing through the closed circuit that runs through one of the lower arm switching elements SW2, SW4, and SW6 that is selected and closed by the processing at step S40 and the processing at step S50. The difference (corresponding to the resulting voltage E1 after subtraction) between the closed circuit current Ic and the offset current serves as a basis in the processing at step S70 to make a definite determination as to whether the insulation resistance is degraded to a degree that can cause a leak in the three-phase alternating current motor 4 in a short time, and to make a notification in that regard. Alternatively, the degradation may be predicted by routinely executing the insulation resistance degradation detecting processing according to the flow on FIG. 3 before or during the normal drive control, under which the inverter 21 is made to output the three phases U, V, and W of alternating power. To predict the degradation, the insulation resistance detected in every insulation resistance degradation detecting processing is recorded.

It is also possible to record the closed circuit current Ic in a previous or earlier insulation degradation detecting for each three-phase alternating current motor 4 or for each of its phases so as to obtain the difference between the recorded closed circuit current Ic and the closed circuit current Ic in the current insulation degradation detecting. When it is predicted from the difference that a insulation degradation is possibly detected in the next or later insulation degradation detecting, this time of prediction may be regarded as the time of detecting the predicted insulation degradation.

Methods for Improving the Sensing Accuracy of the Closed Circuit Current

Two possible methods for improving the detecting accuracy of the above-described closed circuit current Ic will be detailed below.

A first method involves reducing the influence that a floating capacitance has on the detecting of the insulation degradation when the floating capacitance is large on the three-phase alternating current motor 4 itself or on a cable between the inverter 21 and the three-phase alternating current motor 4.

In the embodiment (insulation degradation detecting 1), the insulation degradation detecting is executed based on the closed circuit current Ic constantly flowing through the closed circuit while closing both the detecting switch 32 and a predetermined one of the lower arm switching elements SW2, SW4, and SW6 of the inverter 21. However, when the floating capacitance on the three-phase alternating current motor 4 itself or the floating capacitance on the cable between the inverter 21 and the three-phase alternating current motor 4 is large, the closed circuit current Ic charges the floating capacitance in a short transient time even if an insulation degradation occurs in the three-phase alternating current motor 4. Thus, the closed circuit current Ic does not constantly flow through the closed circuit. In view of this, the first method may be used to improve the accuracy of detecting of the insulation degradation according to the embodiment.

In the first method (insulation degradation detecting 2), either the detecting switch 32 or a predetermined one of the lower arm switching elements SW2, SW4, and SW6 of the inverter 21 is continuously closed. The other one, the detecting switch 32 or a predetermined lower arm switching element, is repeatedly opened and closed for a predetermined number of times, thus intermittently forming the closed circuit. Then, the current transiently flowing through the closed circuit is sampled for a number of times, and the average of the sampled values is obtained. That is, the floating capacitance can be regarded as equivalent to the capacitance of a capacitor. Hence, repeating opening and closing of either the detecting switch 32 or a predetermined one of the lower arm switching elements SW2, SW4, and SW6 of the inverter 21 is equivalent to repeating charging and discharging of the floating capacitance. This ensures that the closed circuit current Ic transiently flows in the closed circuit even if the floating capacitance is large. The average transient closed circuit current Ic is compared with a predetermined threshold, thus determining the degradation of the insulation resistance.

A second method is associated with error adjustment of the current detecting system.

In the second method, a series-coupled unit of an adjusting resistor having a known resistance value and an adjusting switch, not shown, is coupled in parallel to the series-coupled unit of the detecting resistor 31, the detecting switch 32, and the low-voltage source 33. In the second method, prior to the insulation degradation detecting according to the embodiment (insulation degradation detecting 1) or the first method (insulation degradation detecting 2), the detecting switch 32 and the adjusting switch are closed while opening all of the lower arm switching elements SW2, SW4, and SW6 of the inverter 21. This results in an adjusting closed circuit that runs through the detecting resistor 31, the detecting switch 32, the low-voltage source 33, the adjusting resistor, and the adjusting switch. Through the adjusting closed circuit, an adjusting closed circuit current flows and is detected at the detecting resistor 31. In operation, the adjusting closed circuit current has a known value that is determined based on the resistance of the adjusting resistor and the voltage of the low-voltage source 33. The resistance of the adjusting resistor is set to a large degree that is approximately equivalent to the insulation resistance of the three-phase alternating current motor 4 in non-degraded state. The resistance of the detecting resistor 31 is significantly small compared with the resistance of the adjusting resistor. Hence, the resistance of the detecting resistor 31 is sufficiently negligible considering the determination of the adjusting closed circuit current.

Thus, the actual, known current value of the adjusting closed circuit current that actually flows through the adjusting closed circuit is determined based on the resistance of the adjusting resistor and the voltage of the low-voltage source 33. The difference between the actual, known current value of the adjusting closed circuit current and the detected current value of the adjusting closed circuit current, which is detected at the detecting resistor 31, corresponds to the detecting error of the current detecting system. In the second method, the detecting error may be adjusted before activation of the low-voltage source 33 (the adjusting closed circuit current is zero) and after the activation (the adjusting closed circuit current is the actual current value). This ensures adjustment of an offset detecting error of the current detecting system (before the initiation) and an gain detecting error of the current detecting system. The offset detecting error may be subtracted from the value of the insulation degradation detecting prior to the insulation degradation detecting according to the embodiment (insulation degradation detecting 1) or the first method (insulation degradation detecting 2). This increases the accuracy of the detecting. The gain detecting error may be used for gain correction of the value of the insulation degradation detecting after the insulation degradation detecting according to the embodiment (insulation degradation detecting 1) or the first method (insulation degradation detecting 2). This increases the accuracy of the detecting.

The above-described two methods improve the detecting accuracy of the closed circuit current Ic. Specifically, the offset current is detected in advance in the embodiment, and the detecting error of the current detecting system is detected in advance by the second method. Then, the offset current and the offset detecting error are subtracted from the closed circuit current Ic (steady current) in the embodiment (insulation degradation detecting 1). The resulting value is compared with a predetermined threshold to determine the degradation of the insulation resistance. (When a gain detecting error exists, gain correction may be executed to the value of the insulation degradation detecting after the insulation degradation detecting according to the embodiment (insulation degradation detecting 1).) Alternatively, when the floating capacitance of the three-phase alternating current motor 4 itself is large or the floating capacitance of the cable between the inverter 21 and the three-phase alternating current motor 4 is large, the offset current and the detecting error may be subtracted from the average closed circuit currents Ic (transient current) detected in the first method (insulation degradation detecting 2), and the resulting value may be compared with a predetermined threshold. Thus, the degradation of the insulation resistance is determined. (When a gain detecting error exists, gain correction may be executed to the value of the insulation degradation detecting after the insulation degradation detecting according to the embodiment (insulation degradation detecting 1).)

The three-phase alternating current motor 4 used in the embodiment is not limited to the Y-connection. Other examples include a delta connection. The three-phase alternating current motor 4 is applicable to induction motors and synchronous motors, and to rotary motors and linear motors. The three armature winding coils may be suitably configured and arranged in accordance with the kind of the employed motor. The three-phase alternating current motor 4 is also applicable to polyphase alternating current motors other than three phase alternating current motors. In this case, the switching elements of the inverter 21 may be suitably configured and arranged according to the number of the phases.

In the embodiment, the insulation degradation detecting unit 3 is coupled across the negative direct current bus line N and the ground G. This, however, should not be construed in a limiting sense. The insulation degradation detecting unit 3 may also be coupled between the positive direct current bus line P and the ground G. In this case, the negative polarity of the low-voltage source 33 may be coupled to the ground G side in accordance with the polarity of the upper arm switching elements SW1, SW3, and SW5. In this case, the three upper arm switching elements SW1, SW3, and SW5 correspond to the phase switching elements and the axis switching elements recited in the accompanying claims.

In the embodiment, the closed circuit current Ic is detected at the detecting resistor 31 of the insulation degradation detecting unit 3. This, however, should not be construed in a limiting sense. It is also possible to use a current detecting transformer (what is called current transformer) to detect the closed circuit current Ic.

Instead of using the converter 1 as the AC-DC converter, it is possible to use an external direct current power source and couple the direct current bus lines P and N to the output of the external direct current power source, thus supplying direct current power.

It will be appreciated that various embodiments and methods described herein may be readily combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by

Letters Patent of the United States is:

1. A motor driving apparatus comprising:
    at least one motor driving unit comprising an inverter coupled between a positive direct current bus line and a negative direct current bus line of a direct current power source, the inverter being configured to convert direct current power into alternating current power to drive an alternating current motor;
    a low-voltage source coupled between a ground and at least one of the positive direct current bus line and the negative direct current bus line;
    a current detecting element configured to detect a closed circuit current flowing through a closed circuit of the low-voltage source, the alternating current motor, and a part of the inverter; and
    an insulation resistance degradation determinator configured to make a comparison between the closed circuit current detected by the current detecting element and a predetermined threshold, and configured to determine, based on the comparison, whether an insulation resistance of the alternating current motor is degraded,
    wherein the inverter includes a plurality of arm switching elements configured to switch between an open state and a closed state with respect to the alternating current motor,
    wherein the current detecting element is configured to detect:
        the closed circuit current flowing through the closed circuit of the low-voltage source, the alternating current motor, and the part of the inverter with at least one of the arm switching elements of the plurality of arm switching elements being in the open state; and
        an offset current flowing through the closed circuit with all of the arm switching elements of the plurality of arm switching elements being in the open state,
    wherein the motor driving apparatus further comprises an offset removal element configured to obtain a difference between the offset current and the closed circuit current which are detected by the current detecting element, and
    wherein the insulation resistance degradation determinator is configured to make a comparison between the difference and the predetermined threshold.

2. The motor driving apparatus according to claim 1,
    wherein the alternating current motor driven by the at least one motor driving unit comprises a polyphase alternating current motor, and
    wherein the inverter comprises:
        a plurality of phase switching elements corresponding to respective phases of the alternating current motor; and
        a phase selector configured to select at least one of the plurality of phase switching elements to constitute the closed circuit.

3. The motor driving apparatus according to claim 2,
    wherein the at least one motor driving unit comprises a plurality of motor driving units coupled to each other in parallel between the positive direct current bus line and the negative direct current bus line,
    wherein the plurality of motor driving units comprise respective inverters comprising the axis switching elements, and
    wherein the motor driving apparatus further comprises an axis selector configured to select at least one of the axis switching elements of the plurality of motor driving units to constitute the closed circuit.

4. The motor driving apparatus according to claim 3,
    wherein the insulation resistance degradation determinator is configured to determine, based on the comparison, whether the insulation resistance of the alternating current motor is degraded.

5. The motor driving apparatus according to claim 4,
    wherein the current detecting element is configured to detect a closed circuit current that constantly flows through the closed circuit when the closed circuit is continuously formed, and
    wherein the insulation resistance degradation determinator is configured to make a comparison between the constantly flowing closed circuit current and a predetermined threshold, and configured to determine, based on the comparison, whether the insulation resistance of the alternating current motor is degraded.

6. The motor driving apparatus according to claim 2,
    wherein the current detecting element is configured to detect a closed circuit current that constantly flows through the closed circuit when the closed circuit is continuously formed, and
    wherein the insulation resistance degradation determinator is configured to make a comparison between the constantly flowing closed circuit current and a predetermined threshold, and configured to determine, based on the comparison, whether the insulation resistance of the alternating current motor is degraded.

7. The motor driving apparatus according to claim 6,
    wherein the current detecting element is configured to detect a closed circuit current that flows transiently through the closed circuit when the closed circuit is intermittently formed,
    wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

8. The motor driving apparatus according to claim 2,
    wherein the current detecting element is configured to detect a closed circuit current that flows transiently through the closed circuit when the closed circuit is intermittently formed,
    wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

9. The motor driving apparatus according to claim 3,
    wherein the current detecting element is configured to detect a closed circuit current that constantly flows through the closed circuit when the closed circuit is continuously formed, and
    wherein the insulation resistance degradation determinator is configured to make a comparison between the constantly flowing closed circuit current and a predetermined threshold, and configured to determine, based on the comparison, whether the insulation resistance of the alternating current motor is degraded.

10. The motor driving apparatus according to claim 3, wherein the current detecting element is configured to detect a closed circuit current that flows transiently through the closed circuit when the closed circuit is intermittently formed, wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

11. The motor driving apparatus according to claim 4, wherein the current detecting element is configured to detect a closed circuit current that flows transiently through the closed circuit when the closed circuit is intermittently formed, wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

12. The motor driving apparatus according to claim 1, wherein the at least one motor driving unit comprises a plurality of motor driving units coupled to each other in parallel between the positive direct current bus line and the negative direct current bus line, wherein the plurality of motor driving units comprise respective inverters comprising the axis switching elements, and wherein the motor driving apparatus further comprises an axis selector configured to select at least one of the axis switching elements of the plurality of motor driving units to constitute the closed circuit.

13. The motor driving apparatus according to claim 12, wherein the current detecting element is configured to detect a closed circuit current that constantly flows through the closed circuit when the closed circuit is continuously formed, and wherein the insulation resistance degradation determinator is configured to make a comparison between the constantly flowing closed circuit current and a predetermined threshold, and configured to determine, based on the comparison, whether the insulation resistance of the alternating current motor is degraded.

14. The motor driving apparatus according to claim 12, wherein the current detecting element is configured to detect a closed circuit current that flows transiently through the closed circuit when the closed circuit is intermittently formed, wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

15. The motor driving apparatus according to claim 1, wherein the current detecting element is configured to detect a closed circuit current that constantly flows through the closed circuit when the closed circuit is continuously formed, and wherein the insulation resistance degradation determinator is configured to make a comparison between the constantly flowing closed circuit current and a predetermined threshold, and configured to determine, based on the comparison, whether the insulation resistance of the alternating current motor is degraded.

16. The motor driving apparatus according to claim 15, wherein the current detecting element is configured to detect a closed circuit current that flows transiently through the closed circuit when the closed circuit is intermittently formed, wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

17. The motor driving apparatus according to claim 1, wherein the current detecting element is configured to detect a closed circuit current that flows transiently through the closed circuit when the closed circuit is intermittently formed, wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

18. A motor driving apparatus comprising:

at least one motor driving unit comprising an inverter coupled between a positive direct current bus line and a negative direct current bus line of a direct current power source, the inverter being configured to convert direct current power into alternating current power to drive an alternating current motor;

a low-voltage source coupled between a ground and at least one of the positive direct current bus line and the negative direct current bus line;

a current detecting element configured to detect a closed circuit current flowing through a closed circuit of the low-voltage source, the alternating current motor, and a part of the inverter; and an insulation resistance degradation determinator configured to make a comparison between the closed circuit current detected by the current detecting element and a predetermined threshold, and configured to determine, based on the comparison, whether an insulation resistance of the alternating current motor is degraded, wherein the at least one motor driving unit comprises a plurality of motor driving units coupled to each other in parallel between the positive direct current bus line and the negative direct current bus line, wherein the plurality of motor driving units comprise respective inverters comprising axis switching elements, wherein the motor driving apparatus further comprises an axis selector configured to select at least one of the axis switching elements of the plurality of motor driving units to constitute the closed circuit, wherein the motor driving apparatus further comprises:

an offset current detecting element configured to control the current detecting element to detect an offset current with all of the axis switching elements open; and an offset removal element configured to, with the at least one of the axis switching elements selected by the axis selector, obtain a difference between the offset current and the closed circuit current detected by the current detecting element, and wherein the insulation resistance degradation determinator is configured to make a comparison between a predetermined threshold and the difference associated with the closed circuit current, and configured to determine, based on the comparison, whether the insulation resistance of the alternating current motor is degraded.

19. The motor driving apparatus according to claim 18,
wherein the current detecting element is configured to detect a closed circuit current that constantly flows through the closed circuit when the closed circuit is continuously formed, and
wherein the insulation resistance degradation determinator is configured to make a comparison between the constantly flowing closed circuit current and a predetermined threshold, and configured to determine, based on the comparison, whether the insulation resistance of the alternating current motor is degraded.

20. The motor driving apparatus according to claim 18,
wherein the current detecting element is configured to detect a closed circuit current that flows transiently through the closed circuit when the closed circuit is intermittently formed,
wherein the insulation resistance degradation determinator is configured to is configured to make a comparison between a predetermined threshold and an average of values of the transiently flowing closed circuit current obtained from predetermined times of sampling, and configured to determine, based on the comparison, whether the insulation resistance of the alternating current motor is degraded.

* * * * *